United States Patent
Kim

(10) Patent No.: US 8,050,002 B2
(45) Date of Patent: Nov. 1, 2011

(54) HOUSING ARRANGEMENT FOR FAULT DETERMINATION APPARATUS AND METHOD FOR INSTALLING THE SAME

(75) Inventor: Charles J. Kim, Annandale, VA (US)

(73) Assignee: Howard University, Washington, DC (US)

( * ) Notice: Subject to any disclaimer, the term of this patent is extended or adjusted under 35 U.S.C. 154(b) by 273 days.

(21) Appl. No.: 12/262,717

(22) Filed: Oct. 31, 2008

(65) Prior Publication Data

US 2010/0110618 A1    May 6, 2010

(51) Int. Cl.
*H02H 3/00* (2006.01)
*G01R 31/08* (2006.01)
*G01R 31/28* (2006.01)

(52) U.S. Cl. ............... 361/42; 361/1; 324/527; 324/528

(58) Field of Classification Search ............... 361/1, 42; 324/527, 528
See application file for complete search history.

(56) References Cited

U.S. PATENT DOCUMENTS

| | | | |
|---|---|---|---|
| 4,868,826 A | 9/1989 | Smith et al. | |
| 4,887,041 A | 12/1989 | Mashikian | |
| 4,929,887 A * | 5/1990 | Robitaille et al. | 324/66 |
| 5,029,274 A | 7/1991 | Goff | |
| 5,237,511 A | 8/1993 | Caird et al. | |
| 5,448,176 A | 9/1995 | Mashikian | |
| 5,600,248 A | 2/1997 | Westrom | |
| 5,729,144 A | 3/1998 | Cummins | |
| 5,784,393 A | 7/1998 | Byers | |
| 5,790,537 A | 8/1998 | Yoon | |
| 6,181,140 B1 | 1/2001 | Vokey | |
| 6,198,401 B1 | 3/2001 | Newton et al. | |
| 6,313,642 B1 | 11/2001 | Brooks | |
| 6,385,561 B1 | 5/2002 | Soraghan | |
| 6,477,475 B1 | 11/2002 | Takaoka et al. | |
| 6,646,447 B2 | 11/2003 | Cern | |
| 6,725,176 B1 * | 4/2004 | Long et al. | 702/183 |
| 6,759,851 B2 | 7/2004 | Hazelton | |
| 6,842,011 B1 | 1/2005 | Page et al. | |
| 6,856,936 B1 | 2/2005 | Chen | |
| 6,868,357 B2 | 3/2005 | Furse | |
| 6,927,579 B2 | 8/2005 | Blades | |
| 6,934,655 B2 | 8/2005 | Jones | |
| 6,965,303 B2 | 11/2005 | Mollenkopf | |
| 6,972,574 B2 | 12/2005 | Allan | |
| 7,319,574 B2 | 1/2008 | Engel | |

(Continued)

OTHER PUBLICATIONS

International Search Report dated Dec. 14, 2009.

(Continued)

*Primary Examiner* — Jared Fureman
*Assistant Examiner* — Scott Bauer
(74) *Attorney, Agent, or Firm* — Fitch, Even, Tabin & Flannery

(57) ABSTRACT

A fault determination apparatus includes a housing. The housing includes a circuit board disposed there within. The housing is shaped and dimensioned for non-intrusive placement within an existing electrical system. The circuit board is configured to provide one of a transmitter or a receiver within a fault determination system. A first set of connectors is disposed at a first side of the housing and a second set of connectors disposed at the second end of the housing. The first set of connectors and the second set of connectors are directly connected through the wires provided inside the apparatus while at least one wires under fault monitoring are tapped to the circuit board and configured so as to be electrically coupled to the existing electrical system.

15 Claims, 3 Drawing Sheets

U.S. PATENT DOCUMENTS

| | | | |
|---|---|---|---|
| 7,368,919 B2 * | 5/2008 | Gervais | 324/539 |
| 7,432,720 B1 | 10/2008 | Quaife | |
| 2003/0085715 A1 | 5/2003 | Lubkeman et al. | |
| 2003/0125893 A1 | 7/2003 | Furse | |
| 2004/0017203 A1 | 1/2004 | Becker et al. | |
| 2005/0231326 A1 | 10/2005 | Enrico | |
| 2006/0061368 A1 | 3/2006 | Furse | |
| 2008/0273527 A1 | 11/2008 | Short et al. | |
| 2009/0228223 A1 | 9/2009 | Liu et al. | |
| 2010/0171630 A1 | 7/2010 | Carralero et al. | |

OTHER PUBLICATIONS

V.B. Prasad, "The Effects of Intermittent Faults in the Reliability of Digital Systems", IEEE Southeastern '90. Proceedings, vol. 3. pp. 948-952, Apr. 1990.

I. Hakki Cavdar, "Performance Analysis of FSK Power Line Communications Systems Over the Time-Varying Channels: Measurements and Modeling", IEEE Transactions on Power Delivery, vol. 19, issue 1, pp. 111-117, Jan. 2004.

Chun-Hung Liu, Eric Wade, and H. Harry Asada, "Reduced-Cable smart Motors Using DC Power Line Communication", IEEE International Conference on Robotics and Automation, Proceedings, vol. 4., pp. 3831-3838, May 2001.

Paul Smith, Cynthia Furse, and Jacob Gunther, "Analysis of spread spectrum time domain Reflectometry for Wire Fault Location", IEEE Sensors Journal, vol. 5, No. 6, Dec. 2005.

Slenski, G.A., Walz, M.F., "Novel Technologies for Improving Wire System Integrity, "Ninth Aging Aircraft Conference, Atlanta, Mar. 6-9, 2006.

Dr. Paul Smith, and Dr. Cynthia Furse, "State of the Art—Live wire Testing"; http://livewiretest.com/Personal Web page.htm; 27 pages.

Charles Kim and Nicholas Johnson, "Detection of Intermittent Faults in Aircraft Electrical Wire by Utilizing Power Line Communication", 9th joint FAA/DOD/NASA Conference on Aging Aircraft, Mar. 7, 2006, Atlanta, GA.

V. Taylor, and M. Faulkner, "Line Monitoring and Fault Location using Spread Spectrum on Power Line Carrier", IEE Electronics Letters, vol. 143, issue 5, pp. 427-434, Sep. 1996.

"ST7537HS1"—Home Automation Modem, SGS-Thomson Microelectronics, Jun. 1995.

"Power Line Modem Application—Remote control using ST7537 and ST6:Application Note", SGS-Thomson Microelectronics, 1994.

"ST7537—Power Line Application Modem" Application Note, SGS-Thomson Microelectronics, 1995.

Charles Kim and Michael Carraleo, "Functionality Test of PLC Data Error Approach for Detecting Intermittent Faults," 11th joint FAA/DOD/NASA Conference on Aging Aircraft, Apr. 21-24, 2008.

Sandia Report; Unlimited Release, Printed Sep. 2006 R. Kevin Howard, Steven F. Glover, Gary E. Pena, Matthew B. Higgins, Larry X Schneider and Thomas R. Lockner (38 pgs.).

IBEE Sensors Journal, vol. 5, No. 6, Dec. 2005; Feasibility of Spread Spectrum Sensors for Location of Arcs on Live Wires Cynthia Furse, Senior Member, IEEE, Paul Smith, Member, IEEE, Mehdi Safavi, and Chet Lo, Member, IEEE (6 pgs.).

Sub-Cycle Overcurrent Protection for Self-Clearing Faults Due to Insulation Breakdown Ljubomir A. Kojovic, Charles W. Williams, Jr., (12 pgs.).

International Search Report dated Dec. 14, 2010 relating to PCT/US2010/034228.

* cited by examiner

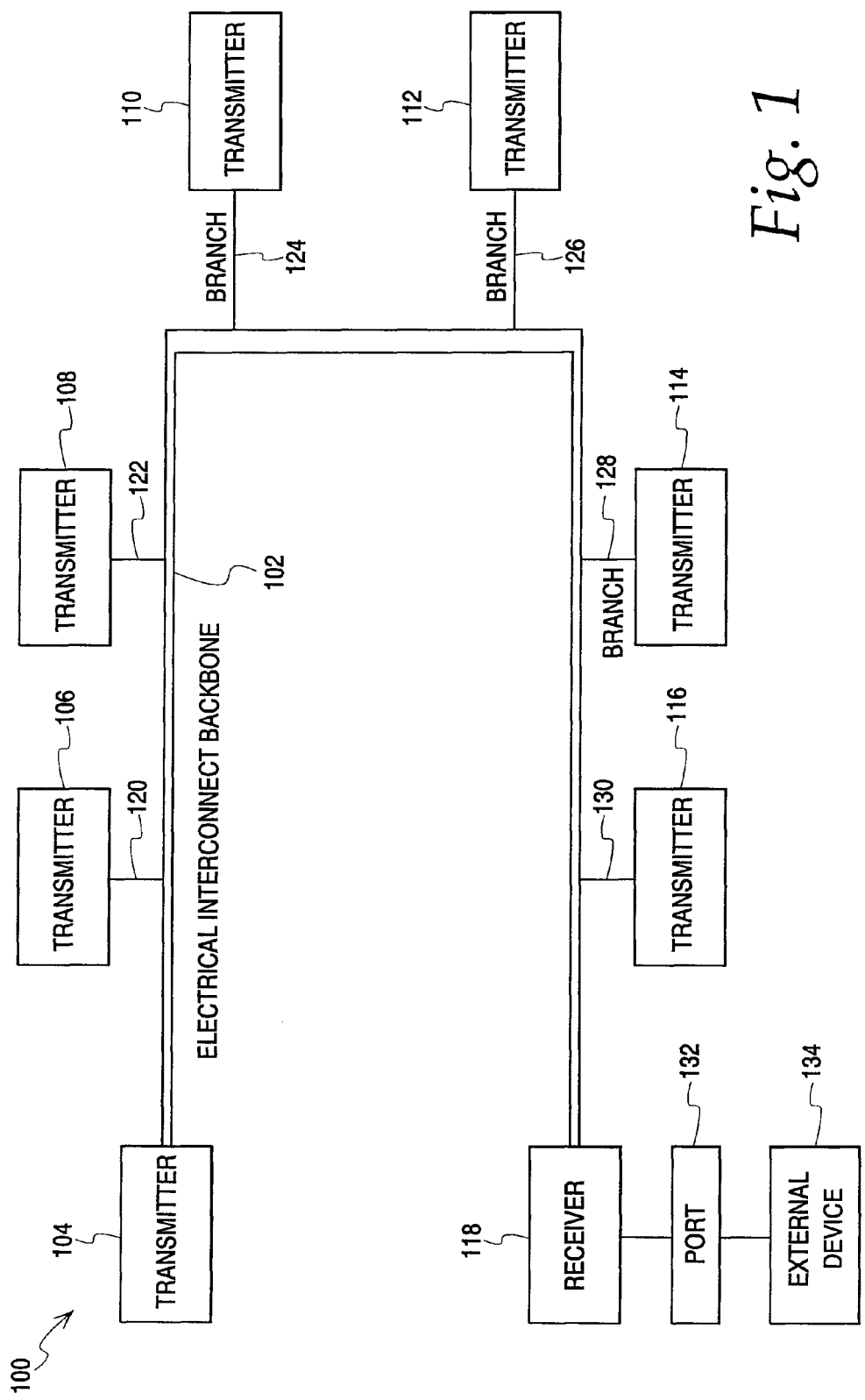

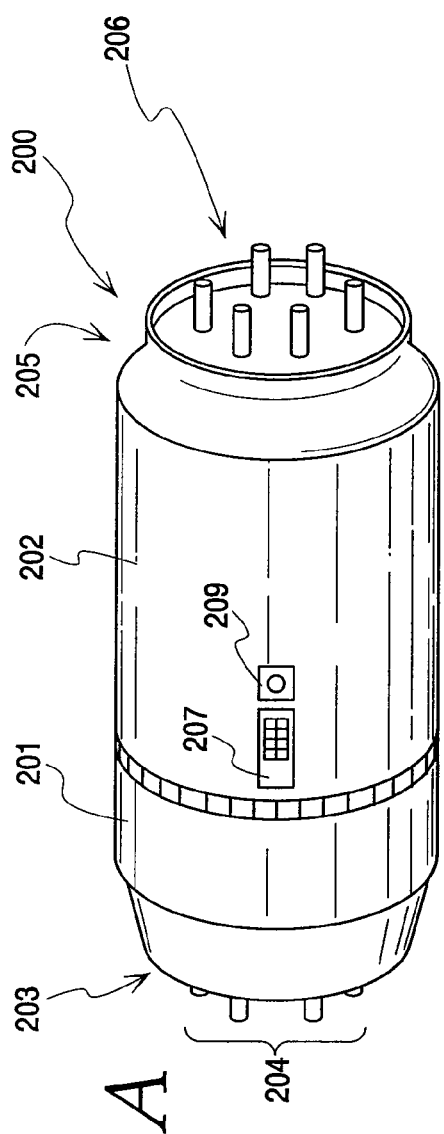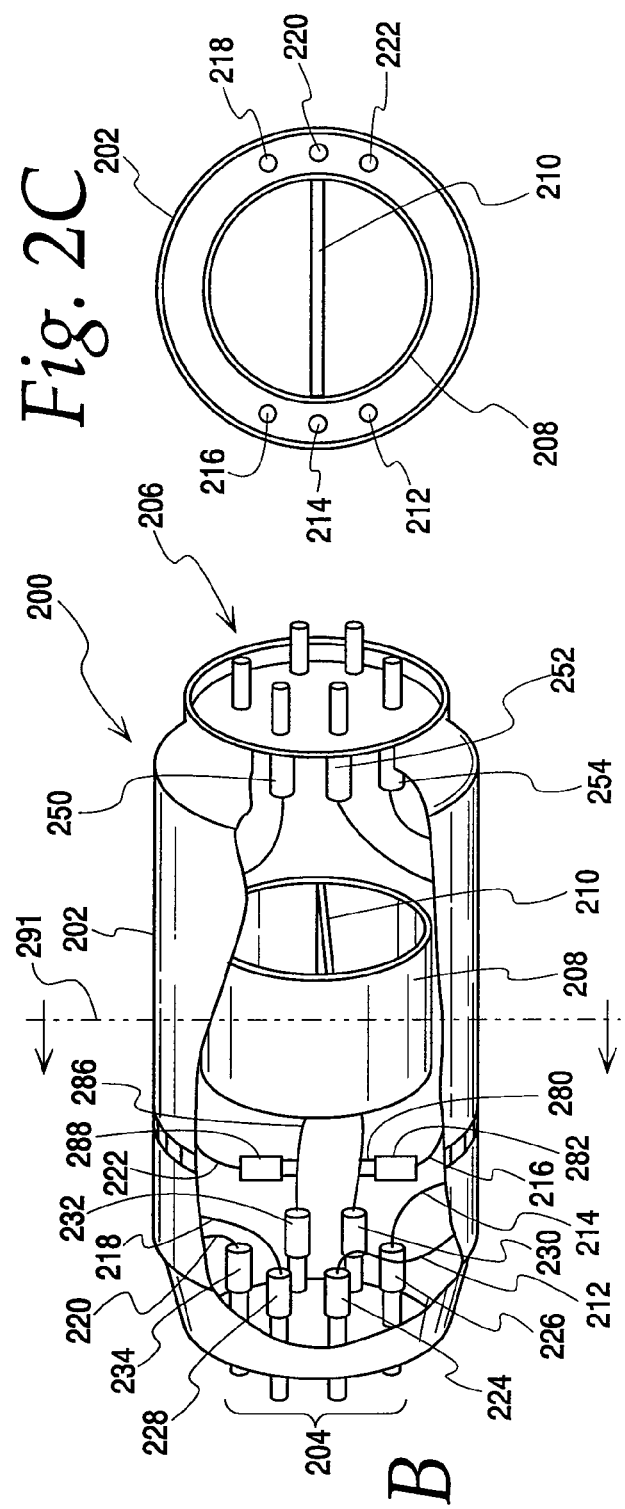

HOUSING ARRANGEMENT FOR FAULT DETERMINATION APPARATUS AND METHOD FOR INSTALLING THE SAME

CROSS REFERENCES TO RELATED APPLICATIONS

Application entitled "System and Method of Detecting and Locating Intermittent Electrical Faults in Electrical Systems" naming Charles Kim as inventor and being filed on the same day as the present application, and provisional application No. 60/846,718 entitled "Method of Detecting Intermittent Faults in Electrical Wire by Utilizing Data Communication Error Over Time," naming Charles Kim as inventor, filed Sep. 24, 2005, the contents of both of which are incorporated herein by reference in their entirety.

FIELD OF THE INVENTION

This application relates to the detection of intermittent electrical faults and, more specifically, to devices that perform fault detection.

BACKGROUND

Intermittent electrical faults are physical events that manifest themselves occasionally and in often unpredictable ways within electrical systems or networks. When an intermittent fault occurs in a system, the system may produce erroneous results or could fail. To take some specific examples of particular electrical faults that occur in networks, a wire may rub against a neighboring wire and a small electrical arc may be created as a result of the contact. In another example, a clamp may break through the insulation surrounding the wire and touch the wire creating a fault. In yet another example, a wire may break at the back end of a connector thereby creating a fault. In still another example, corrosion may create intermittent non-contact between wires and pins within a given system. In another example, cracks on wires within the system may have water dripping on them (or the wires may be in contact with other substances) thereby creating electrical faults. Internal coil turn-to-turn insulation may also fail in systems with electrical coils creating electrical faults.

The consequences of intermittent electrical faults can be severe and, in many instances, can cause substantial damage to the electrical equipment, can result in injury to users, or can even cause the loss of human life. For instance electrical fires may be sparked because of the occurrence of some electrical faults. When the faults occur in aircraft, fuel tank explosions may occur if electrical faults occur near a fuel tank. Even if catastrophic damage or injury does not occur, the operational lifetime of machines or systems may be reduced as the result of the occurrence of intermittent electrical faults.

Previous attempts at identifying electrical faults have relied upon the visual or instrument-aided inspection of electrical systems. However, various disadvantages exist with these previous approaches. For example, the operation of the system frequently had to be suspended to determine if a fault existed thereby causing various problems such as loss of revenue for the owner or operator of the system. Moreover, many locations within existing systems were frequently hard to reach and/or observe thereby severely limiting the effectiveness of these approaches. These previous approaches also proved unable to detect the fault in many cases since the duration of the fault was often short and it was relatively easy for the observer to miss the occurrence of the fault. Additionally, these approaches often relied upon intrusive placement of any equipment used frequently leading to at least some disruption of the existing system.

Other previous approaches relied upon transmitting electromagnetic waves across the network being observed. In one previous example, pulses were transmitted in networks and any reflections were analyzed to determine if a fault existed. More specifically, incident standing waves or impulses were transmitted and then reflected in the network, and then the time between the incident pulse and the reflected pulse was calculated to determine the distance to the location where the pulse was reflected. Different criteria were then used to determine if the reflection was a potential fault. One problem with this technique was that any change in the wire material (e.g., a branch-out in the network) reflected the incident waves resulting in erroneous fault determination. Another problem with this technique was that it required the transmission of high voltage pulses, which some electrical systems with thin coils (e.g., with short wires or thin windings) could not endure. Another time domain reflectometry method employed spread-spectrum techniques, but this approach did not solve the above-mentioned problems since high voltage pulse transmission was still required and reflection still occurred on branches of the electrical network.

Another previous approach transmitted direct-sequence spread-spectrum modulated signals, instead of high voltage signals, and employed signal processing techniques in an attempt to find and locate electrical faults. These approaches, however, still relied on reflectometry that is, sending incident signal and receiving reflected signal and the timing of them for distance calculation. As a result, although this approach may have, under some circumstances, overcome the need to use high voltage incident voltage pulses, it still had the problem of reflection occurring at all points of branching in the network and in the devices that were connected. The reflection from all points in the electrical network also limits the placement of reflectometry techniques to the end of the electrical network, either the source end or the line end, which in a complex network configuration is extremely difficult to satisfy.

BRIEF DESCRIPTION OF DRAWINGS

FIG. 1 is a block diagram of a fault determination system according to various embodiments of the present invention;

FIG. 2a is a perspective view showing a fault determination apparatus according to various embodiments of the present invention;

FIG. 2b is a cut-away perspective view of the fault determination apparatus of FIG. 2a according to various embodiments of the present invention;

FIG. 2c is a cross-sectional view of the fault determination apparatus of FIGS. 2a and 2b along line 291 according to various embodiments of the present invention;

Figure 3:
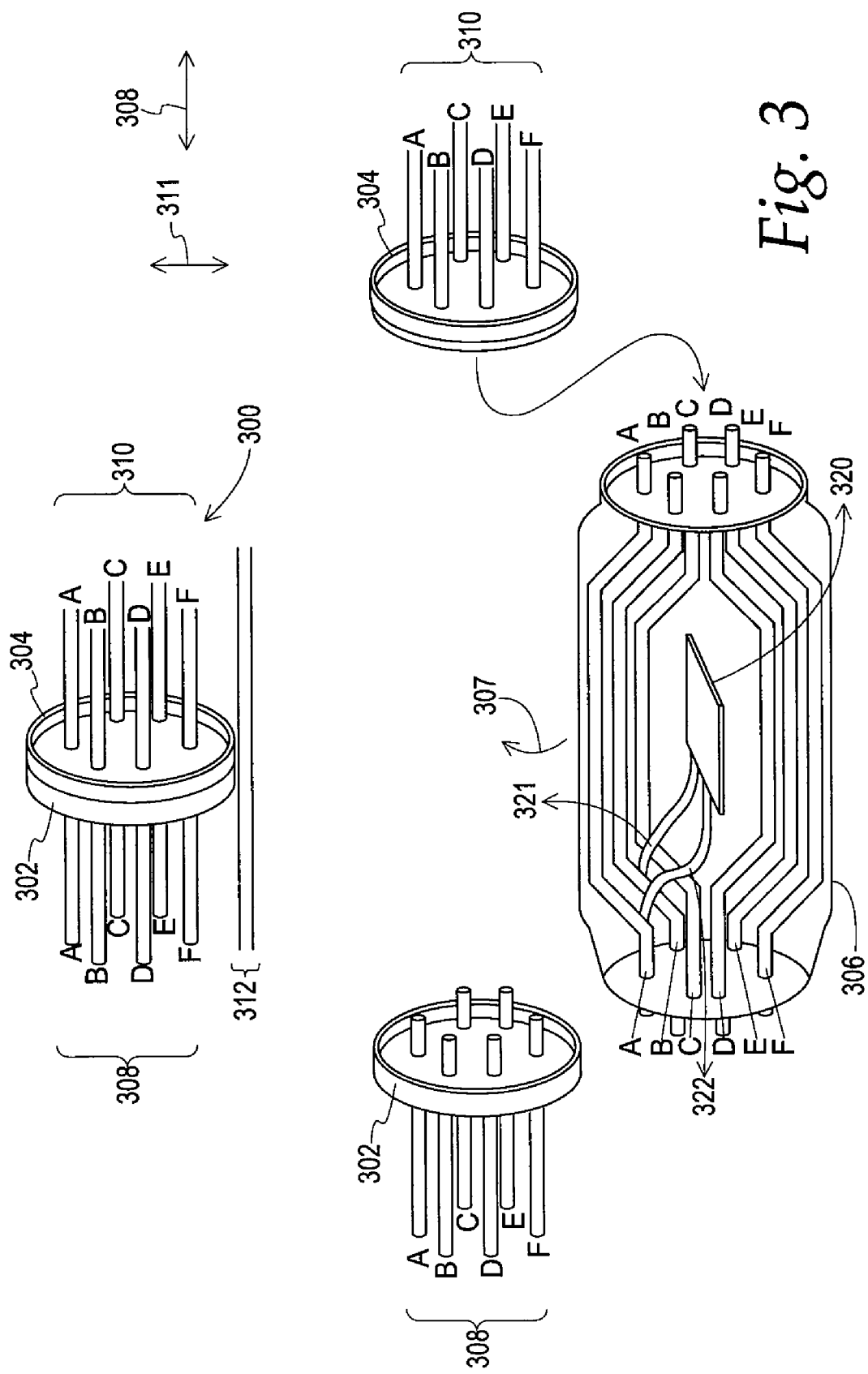
FIG. 3 is a perspective view of the insertion of a fault determination apparatus into an existing electrical system according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE PREFERRED EMBODIMENTS

Approaches are provided wherein a fault determination apparatus can be conveniently installed and operated within an existing electrical system. The devices are configured to conveniently fit within existing systems and can assume any number of shapes and dimensions. Consequently, installation of the devices is easy, and upgrades can be conveniently made without disassembling substantial sections of the existing system.

In many of these embodiments, a fault determination apparatus includes a housing. The housing includes a circuit board disposed therewithin. The housing is shaped and dimensioned for non-intrusive placement within an existing electrical system. The circuit board is configured to operate as one of a transmitter or a receiver of modulated signals over the existing electrical system that can be used for the detection of errors in the signals in order to detect faults in the electrical system. A first set of connectors is disposed at a first side of the housing and a second set of connectors is disposed at the second end of the housing. The first set of connectors and the second set of connectors are directly connected to each other through the wires inside the housing and any two wires selected for transmitter or receiver are tapped to the circuit board and coupled so as to be electrically connectable to the two wires of the existing electrical system.

The existing electrical system may be a variety of different types of electrical systems. For example, the existing electrical system may be an aircraft electrical system, a vehicular electrical system, an electrical system of a building, or the electrical system of a ship. Other examples of existing electrical systems are possible.

The circuit board may be configured in a variety of different ways and include a variety of different components. For example, the circuit board may include a controller, a coupling network, and a modem. Other components may be included on the circuit board.

The fault determination apparatus may also provide other connections to other systems. For example, the circuit board may be power sourced by an external power source via a connector in the housing.

In another example, a communication port is disposed on and through the housing and is in electrical connection with the circuit board. The communication port is coupled to an external device. The external device may be a personal computer, an indicator, and enunciator, or a display to name a few examples. Other examples of external devices are possible.

The fault determination apparatus may also be configured according to a wide variety of dimensions and shapes. To take one example, the housing may be configured according to a generally cylindrical shape. Other examples of shapes are possible.

The present approaches allow for the easy and convenient installation and/or replacement of the fault determination apparatus within an existing electrical system. For example, in others of these embodiments, a position is selected within an existing electrical system in which to insert the fault determination apparatus and the apparatus is shaped and dimensioned for non-intrusive positioning within the existing electrical system. The fault determination apparatus is non-intrusively inserted into the selected position such that the fault determination apparatus is readily accessible to a user. Consequently, the existing electrical system need not be substantially re-worked or re-wired and upgrades to the fault determination apparatus can be quickly and easily made. Moreover, access to the fault determination system is convenient and does not require the removal of existing components of the existing system.

Referring now to the figures and specifically to FIG. 1, one example of an approach for determining and detecting electrical faults in an electrical network 100 is described. An electrical interconnect backbone 102 is coupled to transmitters 104, 106, 108, 110, 112, 114 and 116 via electrical branches 120, 122, 124, 126, 128 and 130 respectively. The electrical interconnect backbone 102 is also coupled to a receiver 118. The electrical interconnect backbone 102 may be any type of electrical connection with varying voltage levels and current types. For instance, the backbone 102 may include two wires (e.g., one ground and the other a wire transmitting a DC current and voltage or two wires of alternating voltage and current). In other examples of backbone arrangements, any number of electrical wires are possible to distribute electrical power. In one example, variety of wires carrying electrical source voltages of approximately 100 vRMS, 28V DC, and carrying electrical control signals can form the backbone 102 and a branch connected to the backbone 102 may have only two wires of alternating 100V source, two wires of 28V DC source, or 3 wires of signals, or any combination thereof. If a segment or branch of 28V DC electrical wires is to be monitored, the transmitter for the branch and a receiver must be both coupled to the two 28V electrical wires. These approaches also apply to alternating current wires. In FIG. 1, it is assumed that the receiver and all the transmitters are coupled to the two same wires in the backbone and branches.

The transmitters 104, 106, 108, 110, 112, 114 and 116 are any type of device capable of transmitting any type of signal over the electrical backbone wires that includes any type of information. For example, the transmitters 104, 106, 108, 110, 112, 114 and 116 may include controllers to form packets or messages, modems to convert the messages to suitable signals (e.g., having the proper voltage levels) for transmission, and a coupling network to provide filtering and protective functions to connect any of the transmitters to the electrical interconnect backbone 102. As mentioned, the transmitters 104, 106, 108, 110, 112, 114 and 116 may operate and transmit packets or messages at any voltage level appropriate for and non-interfering with the electrical interconnect backbone 102.

The receiver 118 is any device capable of receiving electrical signals from any of the transmitters 104, 106, 108, 110, 112, 114 and 116 via the electrical interconnect backbone 102. As with the transmitters 104, 106, 108, 110, 112, 114 and 116, the receiver 118 may include a controller, a modem and a coupling network. As mentioned, the coupling network buffers the receiver from the electrical interconnect backbone 102 and filters in only the modulated signal from the transmitter while rejecting the power signal flowing in the electrical backbone and the modem receives the filtered modulated signal and demodulates the signal to convert it to a digital data stream. The controller receives the digital data from the modem, processes the digital data, and analyzes the errors in the digital data against a set of correct digital data to determine whether a fault has been detected, the likelihood that a fault has been detected and/or the possible location of faults. Various error rates can also be determined.

The receiver 118 communicates with a port 132 and the port 132 is coupled to an external device 134. The external device 134 may be a personal computer, display, enunciator or any other type of device that is capable of alerting a user that a fault has been detected somewhere in the network 100. The location of errors and an error rate may also be displayed. In an alternative approach, the external device 134 may provide some or all of the fault determination processing capabilities rather than the receiver 118.

In one example of the operation of the system of FIG. 1, the transmitters 104, 106, 108, 110, 112, 114 and 116 transmit messages to the receiver 118. The receiver 118 analyzes the messages that it receives and based upon the results of the analysis determines whether a fault exists, the likelihood that a fault exists, and/or the possible (or determined) location(s) of faults (e.g., within a particular branch 120, 122, 124, 126 and 128 or 130 of the network 100). It will be appreciated that although a single receiver is shown in the example of FIG. 1, any number of receivers may be used in the network 100. Additionally, any number of transmitters may be employed in the network 100.

Once errors are detected and/or their locations determined remedial action can be taken. For example, a user can access the potential site of the error, determine if a problem exists, and, if a problem exists remedy the problem (e.g., replace a wire).

Referring now collectively to FIGS. 2a, 2b and 2C, a fault determination apparatus 200 (e.g., one of the transmitters or receivers of FIG. 1) is described. The fault determination apparatus 200 includes an outer housing 202. As shown in this example, the outer housing 202 is generally cylindrical shaped. However, it will be appreciated that the outer housing 202 may be configured according to any shape such that the housing fits conveniently and/or non-intrusively into an existing electrical system. At a first end 203 of the housing 202, connector pins 204 connect the housing to the existing electrical system. At a second end 205 of the housing 202 connector pins 206 connect the housing 202 to the existing electrical system.

The housing 202 may be formed of any suitable material such as a plastic or metal such that the operation of the components within the housing do not substantially interfere with the existing electrical system or vice versa. In addition, although in one example, the housing 202 includes components that form a single transmitter or single receiver, it will be appreciated that the housing 202 may include components that form a transmitter and/or receiver.

The pins 204 and 206 extend through the outer housing 202 and into the interior of the apparatus 200. Although shown as being pins, the connector pins 204 and 206 may alternatively be any type of connector arrangement such as plug-in receptacles. Other examples of connectors and/or connecting arrangements are possible. As mentioned, the pins 204 and 206 connect with plugs or other connector arrangements within existing electrical systems such as connectors within aircraft, vehicles, ships or houses. Other examples of electrical systems are possible. It will be understood that existing plugs or similar arrangements are not needed and that an electrical connection to an existing electrical system may be created by modifying or altering the structure of the existing system (e.g., cutting existing wiring and connecting the existing wiring to the apparatus).

Female connectors 224, 226, 228, 232, and 234 mate with respective ones of the pins 204. An inner sleeve 208 is coupled to the outer housing 202 and includes a circuit board 210. The connection between the inner sleeve 208 and the outer housing 202 may be made in a variety of different ways such as with screws, other fasteners, glue, holders, brackets and/or any other type of arrangement that secures the inner sleeve 208 within the outer housing 202.

The circuit board 210 includes components (e.g., a controller, modem and coupling circuit) that function as a transmitter and/or receiver and determine the existence and location of electrical faults, for example, according to the system described with respect to FIG. 1. In this regard, the female connector 230 is connected to a wire 280. The wire 280 is coupled to the circuit board 210 and a female connector 282. The female connector 282 is coupled to a wire 216 that leads to the second side 205 of the apparatus 200 and one of the pins 206 (and hence the output). Similarly, the female connector 234 (mating to one of the pins 204) is connected to a wire 286. The wire 286 is connected to the circuit board 210 and another female connector 288. The female connector 288 is connected to wire 222 and the wire 222 extends to the second side 205 of the apparatus 200 and one of the pins 206. Consequently, after installation, the apparatus 200 is interconnected with the existing electrical system, without altering any existing wire connections and arrangements for power delivery in the backbone or a branch, while tapping two wires from a branch or background for transmitting or receiving the modulated signal via the backbone or branch. These two wires are the same wires for transmitters and receivers to connect from their circuit boards.

Wires 212 and 214 are connected to female connectors 224 and 226. Wires 218 and 220 are connected to female connectors 228 and 230. Wires 212, 214, 218 and 220 extend to connectors on the second side 205 of the apparatus and are connected to appropriate ones of the pins 206 and the second side 205 (three of the connections to the pins 206 are shown, specifically with female connectors 250, 252, 254).

It will be appreciated that any two out of the incoming wires may be coupled to the circuit board 210. Consequently, the number of pins 204 and 206 may also vary.

The outer housing 202 also includes a communication port 207 and a power port 209. The communication port 207 may be coupled to a personal computer display, indicator, or some other device. The power port 209 may be coupled to an external power source and provide power to the circuit board 210 (and its components) if the circuit board does not have a means to convert power from the tapped two wires into a source for its circuit operation or when, even with such power conversion components on the circuit board, the two wires are not sourced for testing purposes. The ports 207 and 209 are coupled to the circuit board 210.

An end portion 201 of the apparatus 200 is twistable and removable from the remainder of the apparatus 200. The user twists the end portion 201 and removes it from the remainder of the apparatus 200 to access the internal portions of the apparatus 200 inside the outer housing 200. Consequently, a user can make wiring connections or change the wiring connections of the apparatus 200 as required.

The apparatus 200 can assume many dimensions depending upon the environment in which it is used. In one example, the apparatus is generally cylindrical in shape having a length of approximately 15 cm and a diameter of approximately 6 cm. Other examples of shapes and dimensions are possible.

Referring now to FIG. 3, one example of inserting a fault determination apparatus in an existing electrical system 300 is described. The existing electrical system maybe in an aircraft, ship, vehicle, building, or any other type of system or network. Initially, as shown at the top portion of FIG. 3, existing electrical plugs 302 and 304 are coupled together (within the existing electrical system 300). Wires 308, which for example, have six individual wires labeled A through F for power distribution or signal communication purposes extend into and from plug 302 and wires 310 extend into and from plug 304.

A fault determination apparatus 306 is to be inserted within the system 300. As has been described elsewhere herein, the fault determination apparatus 306 performs the functions of a transmitter or receiver in order to determine the existence and location of an electrical fault and transmitted signals flow using a set of two wires.

As shown in the bottom portion of FIG. 3, the plugs 302 and 308 are manually pulled apart or separated and the apparatus 306 is inserted between the plugs as indicated by arrow 307. Consequently, the apparatus 306 fits seamlessly and/or non-intrusively into the existing system 300. Inside the apparatus, all the wires from left connector 302 are directly connected to the right connector 304 in the same order. An additional task, therefore, once the two wires to be monitored for electrical faults are chosen (for example, the wires A and B from the six wires), is to tap the two wires 321 and 322 from the circuit board (transmitter or receiver) 320 to the connectors for wires A and B so that the wires A and B become the signal path for transmitters and receivers while these two wires still serve the intended original purpose of power distribution.

The dimensions of the apparatus 306 are chosen so as to make the apparatus 306 seamlessly fit within the existing electrical system. In one example, the apparatus 306 is approximately 15 cm long and approximately 6 cm in diameter. Other examples of dimensions are possible.

The apparatus 306 may also be configured according to any suitable shape (e.g., a cylinder or rectangle) such that the apparatus fits conveniently within the physical structure of an existing system or the number of wires of the system or the like. In the example of FIG. 3, the apparatus 306 is generally cylindrical in shape so as to fit conveniently within the structure and boundaries of the existing electrical system 300. In other words, the apparatus 306 does not substantially interfere with the operation or space occupied by other components in the electrical system 300.

Additionally, it will be appreciated that the apparatus 306 is positioned within the existing electrical system 300 so as to be easily installed, accessed and/or replaced. For instance, since the apparatus 306 is not covered by the wires 308 and 310, a user can easily install or access the device 306. The configuration and/or dimensions of the apparatus 306 allows upgrades or changes to the apparatus 306 to be easily and quickly made with little or no disruption to the existing electrical system 300. In addition, the configuration of the apparatus is such that it is easily accessible to a user. For example, the apparatus 306 can be easily accessed so that it can be coupled to a portable computing device.

To take a specific example of selecting appropriate dimensions and shapes for the apparatus 306 in the context of the existing system 300, it can be seen that another set of wires 312 of the system 300 is in close proximity to the other components of the system. The wires 312 run parallel and below the wires 308 and 310. The dimensions and shape of the apparatus 306 are chosen such that the apparatus 306 does not over lap the wires 312. For instance, if the shape of the apparatus were an extended rectangle, with a greater dimension in a direction indicated by arrow 311, then the apparatus 306 might overlap or touch the wires 312. However, if the shape of the apparatus 306 is an extended cylinder with a greater length along the direction indicated by arrow 309, and the diameter of the cylinder does not extend beyond the diameters of the plugs, no interference will occur between the wires 312 and the apparatus 306. Moreover, the apparatus 306 will not interfere with the wires 308 and 310. Additionally, using this approach, the apparatus is easily accessible to the user such that various portable computing devices can be coupled to the apparatus via communication port (element 207 in FIG. 2A). Further, via the communication port, displays or other enunciators (connected to the apparatus 306) can be easily seen by users to determine if a fault has been detected in the system.

Consequently, approaches are provided where a fault determination apparatus can be conveniently placed and operated within an existing electrical system. The devices are configured to conveniently fit within existing systems and can assume any number of shapes and dimensions. As a result, installation of the devices is easy, and upgrades can be conveniently made without disassembling substantial sections or portions of the existing system.

While the invention herein disclosed has been described by means of specific embodiments and applications thereof, numerous modifications and variations could be made thereto by those skilled in the art without departing from the scope of the invention.

What is claimed is:

1. A fault determination apparatus for insertion into an existing electrical system comprising:
 a housing including a circuit board disposed there within, the housing shaped and dimensioned for non-intrusive placement within an existing electrical system, the circuit board configured to operate as a receiver within the existing electrical system; and
 a first set of connectors disposed at a first side of the housing and a second set of connectors disposed at the second end of the housing, the first set of connectors and the second set of connectors being coupled to the circuit board and configured so as to be electrically coupled to the existing electrical system, the existing electrical system having multiple electrical branches with a plurality of transmitters disposed therewith, each of the transmitters configured to transmit data packets to the fault determination apparatus;
 wherein the circuit board includes a controller and the controller is configured to receive the data packets transmitted from the plurality of transmitters, the data packets being received from the transmitters without being reflected within the existing electrical system, the controller being configured to perform a comparison of the received data packets to predetermined data and determine whether an intermittent electrical fault exists within the existing electrical system based upon the comparison, the controller further configured to determine a location of the intermittent electrical fault within the existing electrical system.

2. The apparatus of claim 1 wherein the existing electrical system is selected from a group consisting of an aircraft electrical system, a vehicular electrical system, an electrical system of a building, and an electrical system of a ship.

3. The apparatus of claim 1 wherein the circuit board comprises a coupling network, and a modem.

4. The apparatus of claim 1 wherein the circuit board is coupled to an external power source via a connector in the housing.

5. The apparatus of claim 1 further comprising a communication port disposed on and through the housing and in electrical connection to the circuit board.

6. The apparatus of claim 5 wherein the communication port is coupled to an external device.

7. The apparatus of claim 6 wherein the external device is selected from a group consisting of a personal computer, an indicator, and enunciator, and a display.

8. The apparatus of claim 1 wherein the housing is generally cylindrical in shape.

9. A method of installing a fault determination device is an existing electrical system comprising:
- selecting a first electrical branch within an existing electrical system in which to insert a first fault determination apparatus, the first fault determination apparatus shaped and dimensioned for non-intrusive operation within the existing electrical system and operable to transmit first data packets;
- non-intrusively inserting the first fault determination apparatus in the first selected electrical branch such that the first fault determination apparatus is readily accessible to a user;
- selecting a second branch within an existing electrical system in which to insert a second fault determination apparatus, the second fault determination apparatus shaped and dimensioned for non-intrusive operation within the existing electrical system and operable to transmit second data packets;
- non-intrusively inserting the second fault determination apparatus in the second selected branch such that the second fault determination apparatus is readily accessible to a user;
- selecting a third branch within an existing electrical system in which to insert a third fault determination apparatus, the third fault determination apparatus shaped and dimensioned for non-intrusive operation within the existing electrical system and operable to receive the first data packets from the first fault determination apparatus and the second data packets from the second fault determination apparatus;
- non-intrusively inserting the third fault determination apparatus in the third selected branch such that the third fault determination apparatus is readily accessible to a user;
- transmitting the first and second data packets through the existing electrical system from the first fault determination apparatus and the second fault determination apparatus to the third fault determination apparatus without being reflected by the existing electrical system;
- comparing the first and second data packets received at the third fault determination apparatus to a predetermined data set and determining whether an electrical fault exists within the existing electrical system and the location of the fault within the existing electrical system based at least in part upon the comparing.

10. The method of claim 9 wherein the existing electrical system is selected from a group consisting of an aircraft electrical system, a vehicular electrical system, an electrical system of a building, and an electrical system of a ship.

11. The method of claim 9 wherein inserting the first fault determination apparatus or the second fault determination apparatus comprises disconnecting a first plug from a second plug and inserting the first or second fault determination apparatus between the first plug and the second plug.

12. The method of claim 9 wherein inserting the first fault determination apparatus or the second fault determination apparatus comprises breaking two wired connections of the existing electrical system and connecting the wired connections of the existing electrical system to the first or second fault determination apparatus.

13. The method of claim 9 further comprising attaching the first or second fault determination apparatus to an external power supply.

14. The method of claim 9 further comprising coupling the first or second fault determination apparatus to an external device.

15. The method of claim 14 wherein the external device is selected from a group consisting of a personal computer, an indicator, an enunciator, and a display.

\* \* \* \* \*